(12) United States Patent
Tiercelin et al.

(10) Patent No.: US 8,908,422 B2
(45) Date of Patent: Dec. 9, 2014

(54) MAGNETOELECTRIC MEMORY

(75) Inventors: Nicolas Tiercelin, Lille (FR); Yannick Dusch, Lille (FR); Philippe Jacques Pernod, Lille (FR); Vladimir Preobrazhensky, Villeneuve d'ascq (FR)

(73) Assignees: Centre National de la Recherche Scientifique, Paris (FR); Ecole Centrale de Lille Cite Scientifique, Villeneuve d'Ascq (FR)

( * ) Notice: Subject to any disclaimer, the term of this patent is extended or adjusted under 35 U.S.C. 154(b) by 82 days.

(21) Appl. No.: 13/704,850

(22) PCT Filed: Jun. 16, 2011

(86) PCT No.: PCT/IB2011/052633
§ 371 (c)(1),
(2), (4) Date: Jan. 31, 2013

(87) PCT Pub. No.: WO2011/158208
PCT Pub. Date: Dec. 22, 2011

(65) Prior Publication Data
US 2013/0163313 A1    Jun. 27, 2013

(30) Foreign Application Priority Data

Jun. 18, 2010 (FR) .................... 10 02580

(51) Int. Cl.
| G11C 11/00 | (2006.01) |
| G11C 11/14 | (2006.01) |
| G11C 11/15 | (2006.01) |
| G11C 11/56 | (2006.01) |
| G11C 11/16 | (2006.01) |
| H01L 27/20 | (2006.01) |

(52) U.S. Cl.
CPC ............... *G11C 11/14* (2013.01); *H01L 27/20* (2013.01); *G11C 11/5607* (2013.01); *G11C 11/16* (2013.01)
USPC ............ 365/157; 365/158; 365/171; 365/173

(58) Field of Classification Search
USPC ................... 365/157, 158, 171, 173
See application file for complete search history.

(56) References Cited

U.S. PATENT DOCUMENTS

| 6,339,543 B1 | 1/2002 | Shimada et al. |
| 6,829,157 B2 | 12/2004 | Kim et al. |

(Continued)

OTHER PUBLICATIONS

International Search Report for PCT/IB2011/052633 dated Sep. 21, 2011.
Tiercelin Nicolas et al: "Magnetoelectric memory using orthogonal magnetization states and magnetoelastic switching", Journal of Applied Physics, American Institute of Physics. New York, US, vol. 109, No. 7, (Apr. 1, 2011), pp. 7D726-1-7D726-3.

(Continued)

*Primary Examiner* — Trong Phan
(74) *Attorney, Agent, or Firm* — B. Aaron Schulman, Esq.; Stites & Harbison, PLLC.

(57) ABSTRACT

A magnetoelectric memory element includes a magnetic element having an easy magnetization axis aligned along a first axis, means for applying to the magnetic element a magnetic polarization field aligned along a second axis not parallel to the first axis, a piezoelectric or electrostrictive substrate mechanically coupled with the magnetic element, and first and second electrodes arranged to apply an electrical field to the substrate so that the substrate exerts, on said magnetic element, a non-isotropic mechanical stress of a main direction generally oriented along a distinct third axis coplanar with the first and second axes. The magnetic element exhibits, by a combined effect of the magnetic polarization field and the easy magnetization axis, two distinct states of stable equilibrium of magnetization, corresponding to two not mutually opposed magnetization directions. The non-isotropic mechanical stress is sufficiently intense to induce a switchover between the two distinct states.

19 Claims, 5 Drawing Sheets

(56) References Cited

U.S. PATENT DOCUMENTS 7,596,018 B2 * 9/2009 Johnson ............... 365/158
8,138,758 B2 3/2012 Wunderlich et al.
8,546,785 B2 * 10/2013 Yang et al. ............ 365/157

OTHER PUBLICATIONS

Written Opinion of the International Searching Authority for PCT/IB2011/052633 dated Sep. 21, 2011.

* cited by examiner

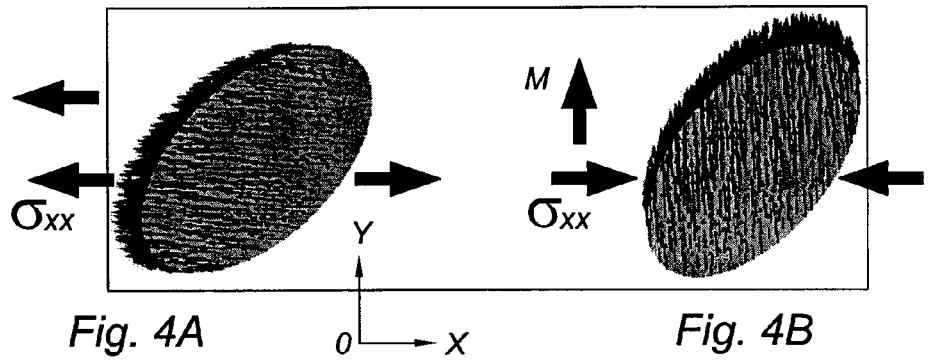
Fig. 4A  Fig. 4B
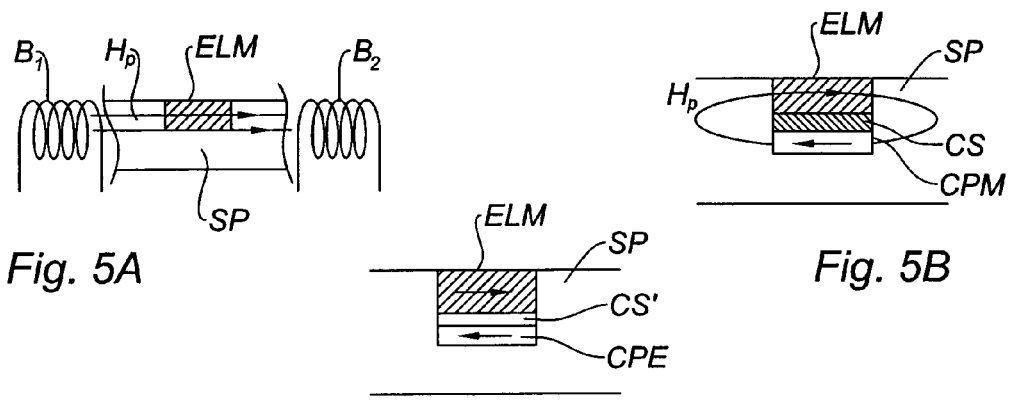
Fig. 5A  Fig. 5B
Fig. 5C
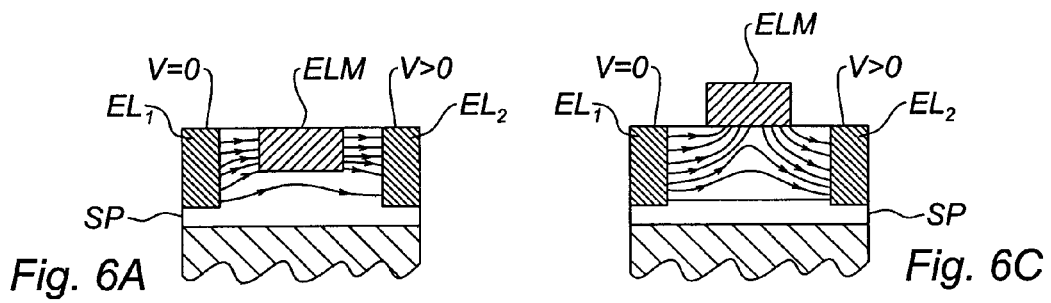
Fig. 6A  Fig. 6C
Fig. 6B  Fig. 6D

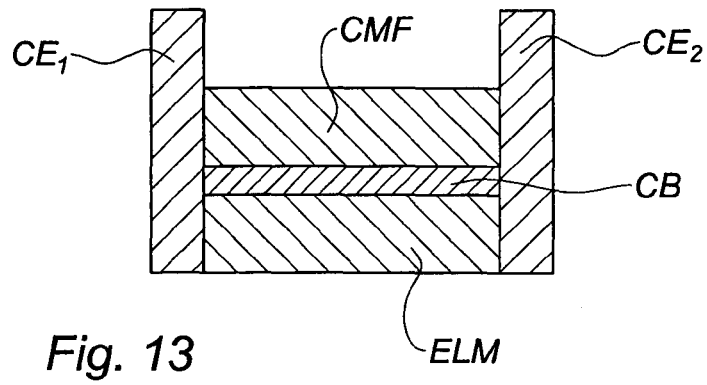
Fig. 13
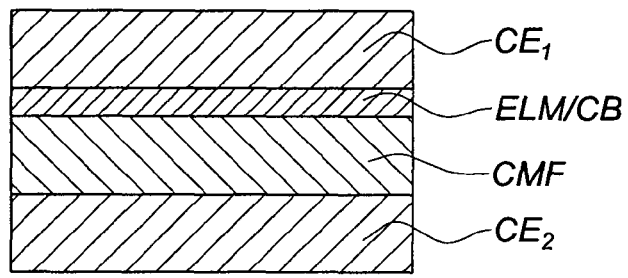
Fig. 14
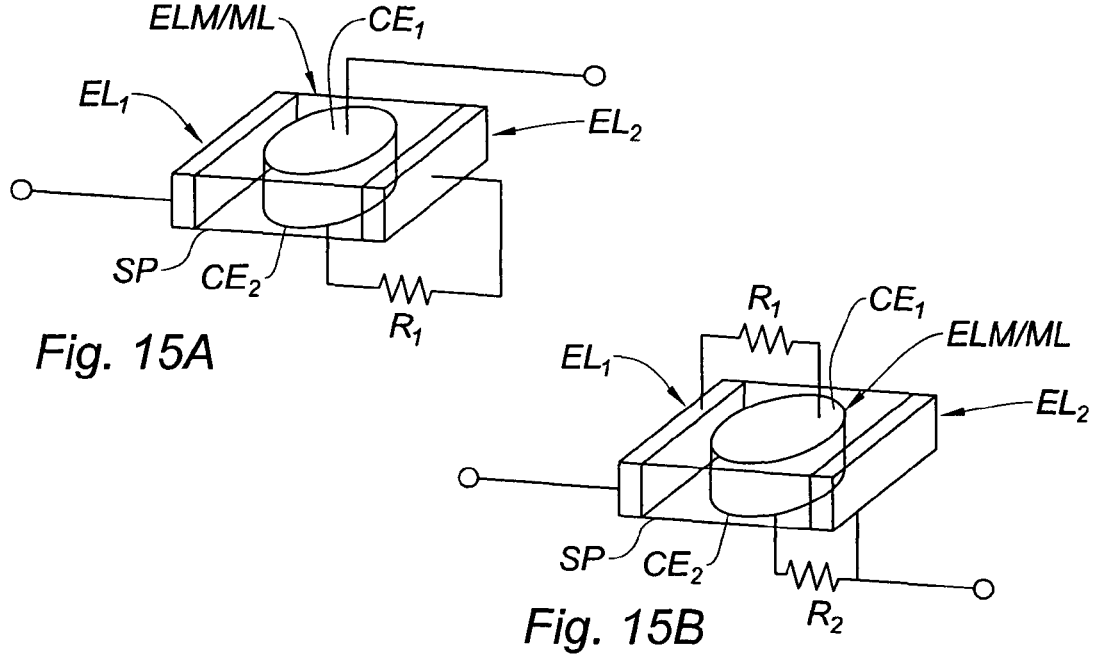
Fig. 15A
Fig. 15B

MAGNETOELECTRIC MEMORY

TECHNICAL FIELD

The invention relates to a memory of magnetoelectric type, and notably to a direct access magnetoelectric memory. More specifically, the invention relates to a magnetoelectric memory element, to a memory cell based on such an element, to a memory comprising a plurality of such cells and to a programmable logic circuit using such cells as means for storing a logic configuration. The invention also relates to a memristive element comprising a magnetoelectric element.

BACKGROUND ART

Nonvolatile memories are electronic devices of very great importance. They can be used in particular as mass memories, replacing the computer hard disks, but also to store the configuration of a programmable digital component such as a user-programmable gate array, or FPGA (field-programmable gate array), replacing the volatile memories (SRAM) currently used in the great majority of these components.

A nonvolatile memory ought to have a high storage density, extremely fast access times (equivalent to those of a conventional static read-only memory, SRAM), low consumption and a long information retention time. At present, a number of memory technologies are currently being studied and validated, at different stages of maturity. Among these technologies, those based on the effects of magnetic kind seem particularly promising. For a review of the current state of development of the magnetic nonvolatile memories, reference can be made to the article by Mark H. Kryder and Chang Soo Kim, "After Hard Drives—What Comes Next?", IEEE Transactions on Magnetics, vol. 45, No. 10, pp. 3406-3413, October 2009.

The list of technologies drawn up by this publication omits a principle which is inciting the interest of many laboratories: magnetoelectric memories, in which the information, stored in a magnetic form, would be written by an electrical command of low energy, typically of voltage type, and read magnetically. In principle, such memories could exploit so-called multiferroic materials, having a ferroelectric phase and a ferromagnetic phase coupled together. The theory predicts a small number of these materials having these characteristics intrinsically, mainly because of constraining conditions of crystalline symmetry which it is necessary to have for the two "ferroelectric" and "ferromagnetic" effects to exist simultaneously. No material fulfilling the right conditions and having sufficiently marked effects at ambient temperature currently exists.

Another solution is the combination of magnetic and ferroelectric materials, or more generally piezoelectric or electrostrictive materials, coupled through mechanical stresses so as to simulate a multiferroic behavior.

The article by V. Novosad et al., "Novel magnetostrictive memory device", J. Appl. Phys., Vol. 87, No. 9, 1 May 2000, and the U.S. Pat. No. 6,339,543, describes a magnetoelectric memory using as information storage elements magnetic particles of ellipsoid form, of sufficiently small size to consist only of a single magnetic domain. Because of their anisotropy of form, these particles exhibit two stable magnetization orientations, mutually opposed and aligned with the great axis of the ellipse. Lines of electrostrictive material crossing at 90° are deposited on a substrate, a magnetic particle being positioned at each intersection with its great axis oriented at 45° relative to the lines. By applying to the electrostrictive lines signals of suitable voltage, it is possible to induce a rotating mechanical stress at a determined particle; by reverse magnetoelastic effect, this in turn induces a rotation of the magnetization. If their timing and their amplitude are chosen shrewdly, these voltage signals can provoke a switchover of the magnetization of this particle from one stable state to the other.

Such a device has a number of drawbacks. Firstly, it is very sensitive to the synchronization of the electrical signals, which complicates its control and limits its response time; this is due to the fact that the field of mechanical stresses has to rotate to "guide" the rotation of the magnetization vector. Secondly, a write operation can only overturn the state of magnetization of a particle; this means that, to write a "0" or a "1" in a memory cell, it is necessary to first read its content in order to determine whether such an overturning should or should not be performed.

The article by M. Overby et al., "GaMnAs-based hybrid multiferroic memory device", Applied Physics Letters 92, 192501 (2008) describes another magnetoelectric memory based on an epitaxial layer of GaMnAs (magnetic semiconductor) deposited on a substrate of GaAs which is thinned and fixed to a piezoelectric crystal. The layer of GaMnAs exhibits two easy magnetization axes, along respective crystalline directions, which correspond to two stable magnetization directions. The application of a mechanical stress, made possible by the piezoelectric crystal, makes it possible to switch over from one stable state to the other. Such a device is complex to fabricate, because the knowledge of the two easy magnetization axes presupposes a fine control of the epitaxial growth conditions. Moreover, despite the application of a mechanical stress, an energy barrier always remains between the two stable states: this means that the switchover has to be thermally assisted, or is performed by tunnel effect, which is likely to limit the speed of response of the memory. The operation of the device has been demonstrated only at cryogenic temperatures.

SUMMARY OF INVENTION

The invention aims to obtain a nonvolatile memory of magnetoelectric type that does not have at least some of the drawbacks of the prior art.

According to the invention, such an aim can be achieved by a magnetoelectric memory element comprising:
- a magnetic element having an easy magnetization axis aligned along a first axis;
- means for applying to said magnetic element a magnetic polarization field aligned along a second axis not parallel to said first axis, the intensity of said field being chosen such that the magnetic element exhibits two directions of stable equilibrium of its magnetization, these directions not being mutually opposed;
- a piezoelectric or electrostrictive substrate mechanically coupled with said magnetic element; and
- at least a first and a second electrode, arranged to apply an electrical field to the piezoelectric or electrostrictive substrate so that said substrate exerts on said magnetic element a non-isotropic mechanical stress, of main direction generally oriented along a third axis, coplanar with, but distinct from, said first and second axes, said mechanical stress being sufficiently intense to induce a switchover of the state of magnetization of said magnetic element by magnetostrictive coupling.

The statement that the main direction of the mechanical stress is "generally oriented along a third axis" should be understood to emphasize the fact that this main direction can vary slightly from one point of the magnetic element to another, the third axis corresponding to the mean direction.

The term "magnetic element" should be understood to mean an element made of a material that can exhibit a magnetic order even in the absence of an external magnetic field. It may notably be a ferromagnetic, ferrimagnetic, sperimagnetic, or even antiferromagnetic element. In the latter case, there is no macroscopic magnetization; there is, nevertheless, a direction of alignment/antialignment of the spins: it is therefore possible to define an "easy magnetization axis" and stable magnetic states. All the materials of this type are more or less magnetostrictive; in physical terms, however, it is advisable for the material forming the magnetic element to have a magnetostrictive coefficient $b^{\gamma,2}$ that is relatively high, for example greater than or equal to 1 MPa and preferably greater than or equal to 10 MPa, for example between 10 and 100 MPa. For a definition of the magnetostrictive coefficient, reference can be made to the following articles:

- E. du Trémolet de Lachaisserie, J. C. Peuzin "Magnetostriction and internal stresses in thin films: the cantilever method revisited", Journal of Magnetism and Magnetic Materials, Vol. 136, pp. 189-196 (1994); and
- E. du Trémolet de Lachaisserie "Definition and measurement of the surface magnetoelastic coupling coefficients in thin films multilayers", Phys. Rev. B, 51 (22), pp. 15925-15932 (1995).

Unlike the device described in the Patent U.S. Pat. No. 6,339,543 and in the abovementioned article by V. Novosad et al., the invention makes it possible to write the value of a bit without having to know the present state of the memory. Furthermore, the writing is done in a simple and fast manner, without problems of synchronization between a number of voltage signals arising.

Unlike the device described by the abovementioned article by M. Overby et al., the two stable magnetic states of the memory element are not obtained by exploiting two axes of anisotropy of the magnetic material, but by virtue of the combined effect of a single axis of anisotropy (geometrical and/or due to the microscopic structure of the material) and of a magnetic polarization field. The result thereof is a more robust device, easier to fabricate and offering the designer greater flexibility. The energy barrier between the two stable states can be completely eliminated at the time of the switchover.

According to other advantageous features of the invention, taken in isolation or in combination:

Said magnetic element may consist of a single magnetic domain.

Said magnetic element may have an elongate form (elliptical, rectangular, lozenge, etc.), wholly or partly determining said easy magnetization axis by anisotropy of form. This embodiment is particularly advantageous, because the direction and the intensity of the anisotropy can be determined easily, and independently of the intrinsic properties of the material.

As a variant or as a complement, said magnetic element may have an anisotrope microscopic structure (mono- or polycrystalline, even amorphous) wholly or partly determining said easy magnetization axis. Advantageously, said anisotrope microscopic structure can be obtained by fabricating said element by deposition in the presence of an external magnetic field.

The memory element may comprise means for generating said magnetic polarization field in the form of an external magnetic field: it may be a coil or another conductor through which a current flows, a permanent magnet or even a leakage field polarization layer.

As a variant or as a complement, said magnetic element may comprise means for generating said magnetic polarization field in the form of an exchange field. It will be understood that the magnetic polarization field is therefore not necessarily a magnetic field in the proper sense.

The memory element may comprise means for generating one said magnetic polarization field substantially perpendicular to said easy magnetization axis (more generally, forming an angle of the order of 80°-100° with said axis). In this case, said electrodes can be arranged in such a way that said substrate exerts on said magnetic element a non-isotropic mechanical stress forming a mean angle of between 40° and 50°, and preferably of approximately 45°, both with said easy magnetization axis and with said magnetic polarization field.

Said electrodes may follow the form of the magnetic element.

Said magnetic element may be deposited on said substrate.

As a variant, said magnetic element may be embedded in said substrate. This variant is particularly suited to conductive magnetic elements.

Said magnetic element may have a single axis of magnetic anisotropy.

Another subject of the invention is a memory cell comprising a magnetoelectric memory element as claimed in one of the preceding claims and a magnetic sensor for determining the direction of the magnetization of said magnetic element. Said sensor may be notably chosen from: a Hall effect sensor and a magnetoresistance, tunnel effect magnetoresistance, giant magnetoresistance or colossal magneto resistance sensor.

Yet another subject of the invention is a direct access nonvolatile memory comprising a plurality of such memory cells arranged according to a matrix scheme in rows and in columns, the first electrodes of the cells of a same column being electrically linked together, as well as the second electrodes of the cells of a samerow.

Yet another subject of the invention is a programmable logic circuit comprising a plurality of such memory cells as means for storing a logic configuration.

Yet another subject of the invention is a memristive device comprising:

- a magnetic element having an easy magnetization axis aligned along a first axis;
- means for applying to said magnetic element a magnetic polarization field aligned along a second axis not parallel to said first axis, the intensity of said field being chosen such that the magnetic element exhibits, by the combined effect of said field and of said easy magnetization axis, two states of stable equilibrium of its magnetization, corresponding to directions of magnetization forming between them an angle $0 \leq \alpha < 90°$;
- a piezoelectric or electrostrictive substrate mechanically coupled with said magnetic element;
- at least a first and a second electrode, arranged to apply an electrical field to the piezoelectric or electrostrictive substrate in such a way that said substrate exerts on said magnetic element a non-isotropic mechanical stress, of main direction generally oriented along a third axis, coplanar with, but distinct from, said first and second axes; and
- a magnetic sensor having two terminals, the electrical resistance between the two said terminals depending on the direction of the magnetization of said magnetic element.

Advantageously, the two said states of stable equilibrium of its magnetization can coincide, the corresponding directions of magnetization forming between them an angle α=0°.

BRIEF DESCRIPTION OF DRAWINGS

Other features, details and advantages of the invention will emerge from reading the description given with reference to the appended drawings given by way of example and which represent, respectively:

FIGS. 4A and 4B, the field of mechanical stresses in the magnetic element of the memory element of FIG. 1 for two different stress states;

FIGS. 5A to 5C, three means for generating a magnetic polarization field according to three variants of the invention;

FIGS. 6A and 6B, two acceptable configurations of the memory element of FIG. 1;

FIGS. 6C and 6D, two other configurations of the memory element of FIG. 1, acceptable only on condition that the magnetic element is not conductive;

FIGS. 12, 13 and 14, three memory cells according to different embodiments of the invention, combining a magnetoelectric memory element and a magnetoresistive sensor; and FIGS. 15A and 15B, two possible modes of connection of a memristive device according to another embodiment of the invention.

DESCRIPTION OF EMBODIMENTS

Figure 1:
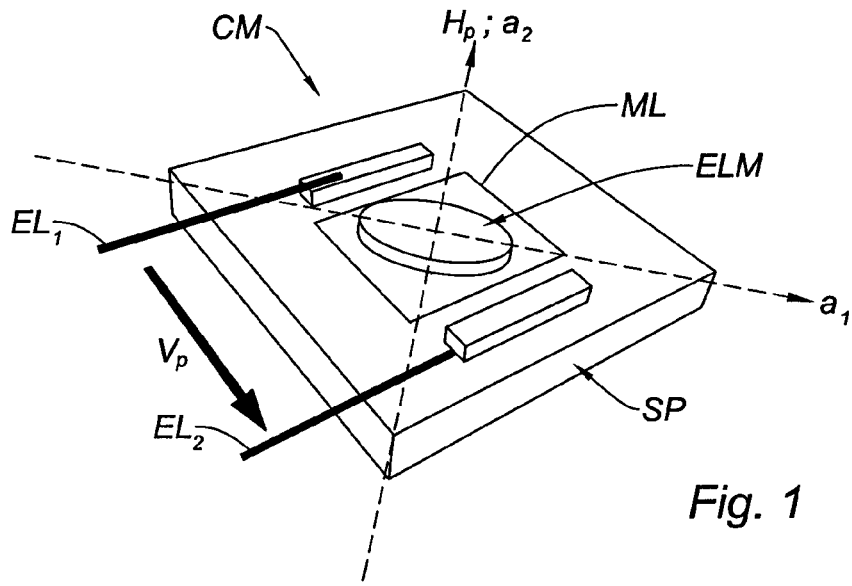
FIG. 1, a diagram of a memory element according to an embodiment of the invention.

The geometry of a magnetoelectric memory cell CM according to an embodiment of the invention is illustrated by FIG. 1. The memory cell comprises a memory element ELM, having two stable states and means capable of inducing a switchover between these states, and reading means ML (the latter being represented purely schematically).

The memory element ELM is based on a magnetic element ELM of ellipsoid form, of dimensions small enough to ensure that it comprises only a single magnetic domain; for example, its greatest axis can have a length of the order of 100 nm or less. As explained above, the term "magnetic element" should be understood to mean an element made of a material that can exhibit a magnetic order even in the absence of an external magnetic field, such as a ferromagnetic or ferrimagnetic material. Through its form, the magnetic element ELM has a preferred direction of magnetization, called "easy magnetization axis", or simply "easy axis", along its great axis. This easy magnetization direction is identified in the figure by reference $a_1$. It will be noted that this anisotropy of form makes no distinction between the positive or negative direction of the easy axis $a_1$.

A polarization magnetic field, indicated by $H_p$, is applied in a direction $a_2$ perpendicular to that of the easy magnetization axis $a_1$; in the case of the example, this direction $a_2$ is therefore parallel to the small axis of the ellipse. Unlike the anisotropy of form according to $a_1$, the polarization field favors the magnetization of the element ELM in a direction parallel to the positive direction of the axis $a_2$ and makes its magnetization more difficult in an opposite direction. The intensity of this field is chosen between $\sqrt{2}/2$ and 1 times the intensity of the equivalent magnetic field characterizing the anisotropy of form.

Conventionally, axes X, Y are defined forming an angle of 45° relative to $a_1$ and $a_2$; in the system of coordinates XOY (O being the origin) thus defined, the axis $a_1$ is oriented along the bisector of the first and the second quadrants, and the axis $a_2$ along the bisector of the second and the third quadrants.

Figure 2:
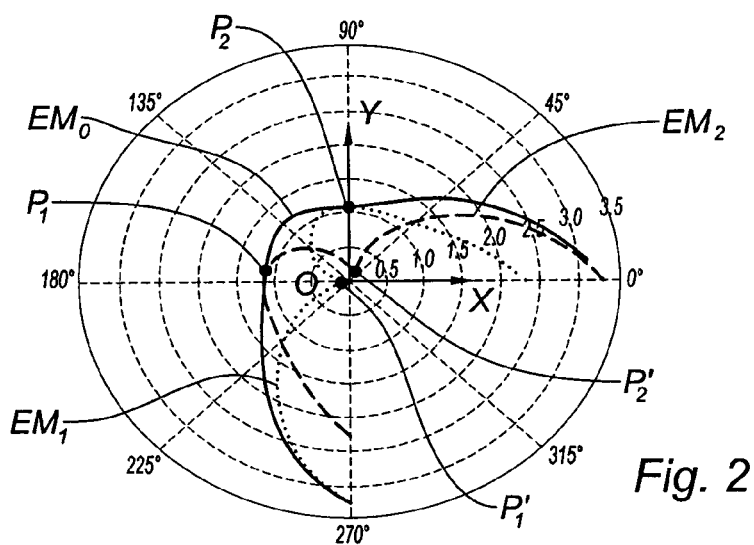
FIG. 2, a magnetic energy profile of the memory element of FIG. 1 for three different stress states, highlighting the switchover between the two magnetic equilibrium states.

In FIG. 2, the curve $EM_0$ (continuous line) shows, in polar coordinates, the profile of the magnetic energy of the system, that is to say the magnetic energy stored in the element ELM as a function of the angle between the magnetization vector and the axis X. It can be seen that this profile exhibits two energy minima, that is to say two stable magnetization orientations. In the particular case where the axis $a_2$ and perpendicular to $a_1$ and the intensity of the field $H_p$ has the value $\sqrt{2}/2$ times the intensity of the equivalent magnetic field characterizing the anisotropy of form, these stable orientations are exactly in the directions –X and Y. These orientations (or "positions") of stable equilibrium are indicated by the references $P_1$ and $P_2$. They are separated by an energy barrier. The element ELM therefore constitutes a bistable element, capable of storing an information bit: for example, a magnetization state according to the stable orientation $P_1$ can represent a logic zero and a magnetization state according to the stable orientation $P_2$ a logic "one", or vice versa.

Figure 3:
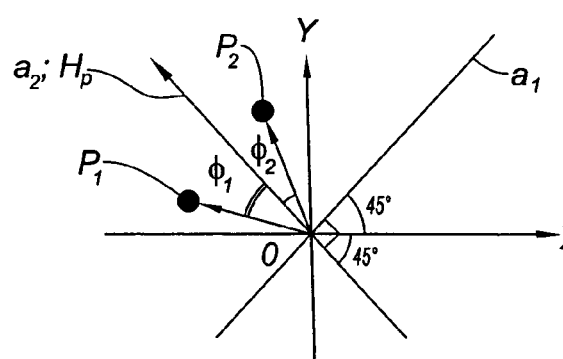
FIG. 3, a geometrical representation of the magnetic equilibrium states of the memory element of FIG. 1.

FIG. 3 shows more schematically the orientation of the axes $a_1$ and $a_2$ and of the positions of equilibrium $P_1$, $P_2$. As noted above, axes X, Y form an angle of 45° relative to $a_1$ and $a_2$. FIG. 3 relates to the more general case where the orientations of equilibrium do not coincide with the axes –X and Y. As indicated in FIG. 3, the vector for the position of equilibrium $P_1$ forms an angle of $\phi_1$ relative to $a_2$, and the vector for the position of equilibrium $P_1$ forms an angle of $\phi_2$ relative to $a_2$.

The magnetic element ELM is embedded in a piezoelectric substrate SP. Two electrodes $EL_1$, $EL_2$ are deposited on (or embedded in) this substrate to polarize it in the direction OX. Depending on the sign of the potential $V_p$ applied between these two electrodes, the piezoelectric substrate SP generates a mechanical compression or traction stress $\sigma_{xx}$ whose main direction is oriented in the direction OX, which is applied to the magnetic element ELM. The latter exhibits a magnetoelastic effect: consequently, the mechanical stress $\sigma_{xx}$ modifies the profile of the magnetic energy of the system.

In order to increase the stress applied to the magnetic element, for a given potential difference $V_p$, it may be advantageous to surround the device with a material with high modulus of elasticity, such as AlN (300 GPa), TaN (>500 GPa), tungsten carbide WC (>700 GPa) or diamond (>1400 GPa)—for comparison, the PZT ceramics exhibit a modulus of elasticity less than 100 GPa.

In FIG. 2, the dotted line curve $EM_1$ illustrates the magnetic energy profile of the system in the presence of a mechanical traction stress $\sigma_{xx}$. It can be seen that there is a single point of stable equilibrium $P'_1$, corresponding to a magnetization oriented in the direction $-X$. The situation is illustrated also in FIG. 4A, where the reference M indicates the magnetization vector. It will be understood that, after the stresses are relaxed (when $V_p$ reverts to a zero value), the system is necessarily in the state $P_1$, independently of its initial state (before the application of the potential difference $V_p$).

Still in FIG. 2, the broken line curve $EM_2$ illustrates the magnetic energy profile of the system in the presence of a mechanical compression stress $\sigma_{xx}$. It can be seen that there is a single point of stable equilibrium $P'_2$, corresponding to a magnetization oriented in the direction $+Y$. The situation is illustrated also in FIG. 4B. It will be understood that, after the stresses are relaxed (when $V_p$ reverts to a zero value), the system is necessarily in the state $P_2$, independently of its initial state (before the application of the potential difference $V_p$).

It has therefore been shown that the application of an electrical signal $V_p$ to the electrodes $EL_1$, $EL_2$ makes it possible to modify the magnetization state of the element ELM. The magnetization state thereof, and therefore the value of the bit stored by the memory cell, depends only on the sign of $V_p$, and not on the state before the application of the signal. The memory cell can therefore be written without it necessarily having to be read first.

Simulations have shown that the switchover time of the memory cell becomes shorter as the mechanical stress applied increases. Thus, there is a link between energy consumption (linked to the intensity of the mechanical stress) and writing speed. It is therefore possible to choose to maximize this speed, at the cost of a relatively high consumption, or else to minimize the energy consumption at the cost of slower switchover, or even to seek a trade-off between these two opposing requirements.

The switchover speed can, optionally, be increased by the application, simultaneously with the mechanical stress, of a transient magnetic field, oriented in the direction of $P_1$ or of $P_2$.

Figure 11:
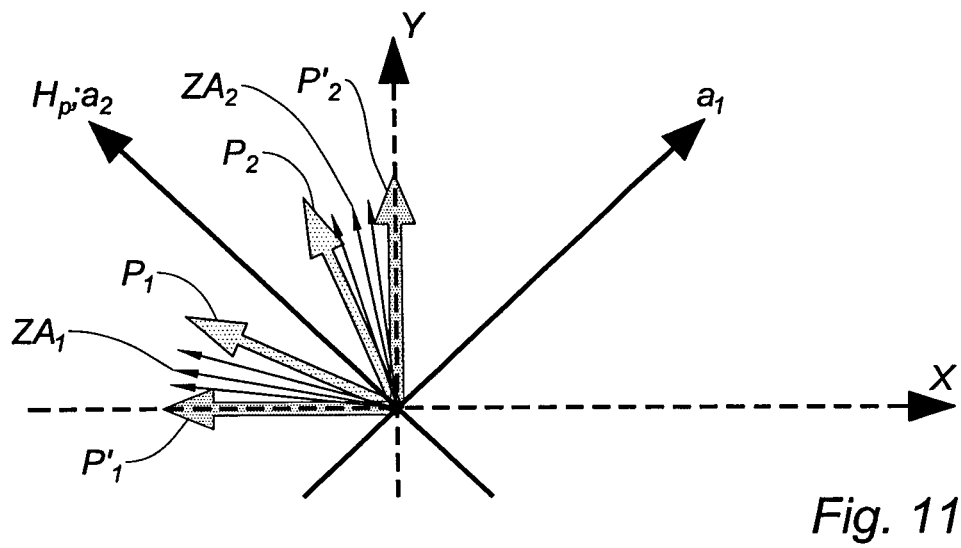
FIG. 11, a geometrical representation of the magnetic equilibrium states of the memory element of FIG. 1 highlighting the possibility of a use with four states and of an analog use.

A device according to the invention can be used as a bistable device, exhibiting only two stable states, $P_1$ and $P_2$. However, when these two states do not correspond to mutually perpendicular magnetization directions, a four-state operation is possible, to store two bits in a single memory element. The four states are $P'_1$ (magnetization along the axis $-X$, obtained by the application of a traction stress of maximum intensity), $P_1$ (stable state in the absence of mechanical stress), $P_2$ (stable state in the absence of mechanical stress) and $P'_2$ (magnetization along the axis Y, obtained by the application of a compression stress of maximum intensity); this situation is illustrated in FIG. 11. In other words, the states $P'_1$ and $P'_2$ can be used as stable states of the memory element, and not only as intermediate states reached transiently during a switchover. It will be understood that this four-state operation is volatile, because the states $P'_1$ and $P'_2$ cannot be maintained indefinitely in the absence of power supply, because the capacitor formed by the electrodes $EL_1$ and $EL_2$ tends to discharge. It will be understood that the states $P'_1$ and $P'_2$ are maintained as long as the capacitor formed by the electrodes $EL_1$ and $EL_2$ remains charged. It is therefore advantageous to design the memory element in such a way as to minimize the leakage currents tending to discharge this capacitor.

By starting from the state $P'_1$ and by progressively reducing the intensity of the traction stress, the magnetization rotates progressively toward the direction identified by the state $P_1$, thus defining a first area of analog operation $ZA_1$. Similarly, by starting from the state $P'_2$ and by progressively increasing the compression stress, the magnetization can be made to rotate toward the direction identified by the state $P_2$, thus defining a second area of analog operation $ZA_2$. In the areas of analog operation, the orientation of the magnetization depends continuously on the stress, and therefore on the voltage applied to the piezoelectric substrate, that is to say on the state of charge of the capacitor formed by the electrodes $EL_1$ and $EL_2$. If, as will be explained in detail below, the magnetic element is coupled to a magnetoresistive sensor, for example of the giant magnetoresistance type, then the resistance $R_c$ of this sensor depends on the orientation of the magnetization of the element ELM and therefore, indirectly, on the charge Q stored in the capacitor $EL_1$-$EL_2$: $R_c=f(Q)$. The assembly made up of the element ELM, the piezoelectric substrate SP, the electrodes $EL_1$, $EL_2$ and the magnetoresistive sensor ML therefore exhibits a behavior of "memristive" type, more complex than a simple "memristor" because it has four terminals (the two electrodes $EL_1$, $EL_2$ and the two terminals $CE_1$, $CE_2$ of the magnetoresistive sensor—see FIGS. 12 to 14). By linking together the terminals $EL_2$ and $CE_2$ through a resistor $R_1$ in the assembly ELM/ML, a device with two terminals is obtained that can be modeled, in a first approximation, by a memristor connected in series to a capacitor and to a resistor; this connection is schematically represented in FIG. 15A. By linking $EL_1$ with $CE_1$ through a first resistor $R_1$ and $EL_2$ with $CE_2$ (or $EL_1$ with $CE_2$ and $EL_2$ with $CE_1$) through a second resistor $R_2$ in the assembly ELM/ML, another device with two terminals is obtained that can be modeled, in a first approximation, by a memristor (in series with a resistor $R_{tot}=R_1+R_2$) connected in parallel to a capacitor; this connection is represented schematically in FIG. 15B.

If the desire is to exploit the memristive behavior of the device, it may be advantageous to choose a polarization field $H_p$ of intensity greater than or equal to that of the equivalent magnetic field characterizing the anisotropy of form, such that $P_1$ and $P_2$ coincide, and the areas of analog operation $ZA_1$ and $ZA_2$ are joined together. In these conditions, the resistance of the magnetoresistive sensor varies continuously when the charge stored in the capacitor $EL_1$-$EL_2$ varies from $-Q_{max}$ to $+Q_{max}$. It will be understood that such a device, exhibiting a single state of stable magnetization in the absence of applied stress (or, which is equivalent, two degenerate states, characterized by two identical magnetization directions), cannot be used as non-volatile memory.

A reading means ML is represented schematically in FIG. 1. It can be any type of magnetic sensor, for example of the Hall effect, magnetoresistance, tunnel effect magnetoresistance, giant magnetoresistance or colossal magnetoresistance type. It may be integrated or discrete. In general, the reading is not destructive.

The use of a magnetoresistive sensor of giant magnetoresistance (GMR) or magnetic tunnel junction (MTJ) type is particularly preferred. Generally, these sensors associate a magnetic layer with variable magnetization and a layer whose magnetization remains fixed, these two layers being separated by a barrier layer which may be conductive (case of the GMR effect) or insulating (case of the MTJ effect).

Figure 12:
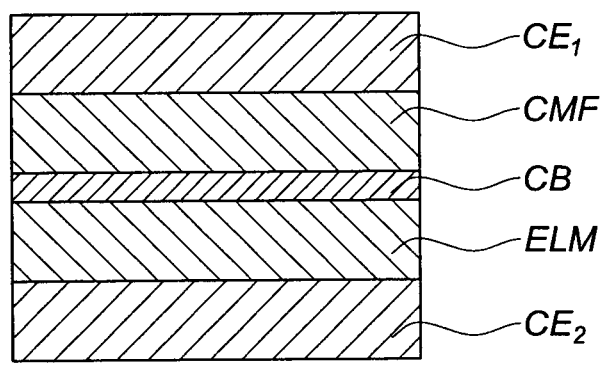

FIG. 12 illustrates the case of a GMR or MTJ sensor of the "current perpendicular to the plane" (CPP) type. In this case, the magnetic element ELM is conductive and acts as magnetic layer with variable magnetization. The reference CMF indicates the layer for which the magnetization remains fixed, and CB the barrier layer, of nanometric thickness, which may be conductive (case of the GMR effect) or insulating (case of the MTJ effect). This stacking of layers is gripped between two electrical contacts or terminals $CE_1$, $CE_2$.

FIG. 13 illustrates an alternative architecture, called "current in the plane" (CIP) architecture, in which the resistance of the stack of layers ELM/CB/CMF is measured in on the edge of said stack. This architecture presupposes a conductive barrier layer, and therefore an operation of GMR type.

When the magnetic element ELM is not conductive, it is possible to use an MTJ architecture of CPP type without barrier layer—or rather one in which the element ELM acts both as magnetic layer and as barrier layer—as illustrated in FIG. 14. The thickness of this element ELM must then be of the order of a nanometer and, for example, approximately 2 nm. It is difficult to apply a mechanical stress to the edge of such a thin layer; thus, the stress will preferably be applied to the entire stack.

In all cases, the electrical resistance measured between $CE_1$ and $CE_2$ depends on the angle $\alpha$ formed by the magnetization directions of the element ELM of the fixed layer CMF, and takes its minimum value for a zero angle (parallel magnetizations) and its maximum value for an angle of 180° (antiparallel magnetizations).

In the case of the GMR-CPP architecture of FIG. 12, the resistance $R_c$ measured between the contacts $CE_1$ and $CE_2$ is given, according to a phenomenological model, by an equation of the form:

$$R_c = a - b \cdot \cos^2(\alpha/2) + c \cdot \cos^4(\alpha/2)$$

where a, b and c are positive constants which depend on different characteristics of the device. For a given direction of magnetization of the layer CMF, $R_c$ depends on the state $P_1$ or $P_2$ of the element CEM; there are therefore two resistance values, $R_c(P_1)$ and $R_c(P_2)$. The above equation can therefore be used to find the direction of magnetization of the layer CMF which maximizes the resistance contrast $C_R = |(R_c(P2) - R_c(P1))/R_c(P1)|$.

In the case of an MTJ-CPP architecture (FIG. 12 or 14), the conductance $G_c$ measured between the contacts $CE_1$ and $CE_2$ is given, also according to a phenomenological model, by an equation of the form:

$$G_c = G_p \cdot \cos^2(\alpha/2) + G_{ap} \cdot \sin^2(\alpha/2)$$

where $G_p$ and $G_{ap}$ are the conductances of the tunnel junction for parallel and antiparallel magnetizations respectively. Here again, the equation can be used to determine the direction of magnetization of the layer CMF which maximizes the resistance contrast $R_c = 1/G_0$.

In the case of the GMR-CIP architecture, the following applies:

$$R_c = a - b \cdot \cos(\alpha)$$

It is easy to check that the resistance contrast is maximum when the states $P_1$ and $P_2$ correspond to mutually perpendicular magnetization directions, one of which coincides with the direction of magnetization of the layer CMF.

The above equations show that the resistance (conductance) is an even function of the angle $\alpha$ between the magnetizations. This means that if the magnetization of the fixed layer is in the direction of the polarization field $H_p$, and therefore at mid-path between the two positions of equilibrium $P_1$ and $P_2$, the resistance (conductance) obtained is the same for the two states of the memory element, therefore the contrast is zero, which does not allow the information to be read (for the time being, the case where the directions identified by $P_1$ and $P_2$ are not symmetrical relative to $H_p$ is set aside).

This poses a two-fold difficulty:

on the one hand, the leakage magnetic field generated by the layer CMF is superimposed on the polarization field $H_p$, modifying the positions of equilibrium of the magnetic element;

on the other hand, the polarization field $H_p$ can have a tendency to modify the state of magnetization of the "fixed" layer.

There are several solutions for remedying this difficulty. For example:

The polarization field $H_p$ may not be a magnetic field, but an effective field translating the effect of an exchange interaction with a thin layer (typically of the order of 2 nm) of antiferromagnetic material deposited on—or under—the element ELM. The exchange interactions are of short range, therefore they do not disturb the magnetization of the layer CMF, which is too far away. As for the leakage field effect generated by said layer, it can be compensated by appropriately choosing the direction and the intensity of the effective field $H_p$.

Conversely, the state of magnetization of the layer CMF can be maintained constant by exchange coupling with an antiferromagnetic layer. The force of this coupling renders the layer CMF insensitive to the polarization field $H_p$ (of magnetic kind) whereas its short range prevents the magnetization state of the element ELM being affected.

The two approaches can be combined, two distinct antiferromagnetic layers being used to create an effective polarization field $H_p$ and to fix the magnetization of the layer CMF. However, this solution is difficult to implement for technological reasons.

The layer CMF can, just like the element ELM, have an easy magnetization axis (of geometrical or different nature), which cooperates with the polarization field to determine two stable magnetization states, but not be magnetostrictive (or be so much less than the element ELM, or even exhibit a stronger anisotropy). In these conditions, the application of a mechanical stress provokes a switchover of the magnetization state in the element ELM, but not in the layer CMF; The benefit of this approach is that the polarization field $H_p$ does not disturb the magnetization state of the layer CMF; on the contrary, it contributes to its stability. However, in the dimensioning of the device, account must be taken of the fact that the leakage magnetic field generated by CMF influences ELM, and vice versa.

The layer CMF can be made of a material with very strong magnetocrystalline anisotropy, of permanent magnet type, the magnetization of which is practically insensitive to the polarization field $H_p$. However, in the dimensioning of the device, account must be taken of the leakage magnetic field generated by this layer, which is likely to affect the magnetization of the magnetic element ELM superimposed on $H_p$.

If the polarization field $H_p$ is not perpendicular to the easy magnetization axis of the element ELM, then the positions of equilibrium $P_1$ and $P_2$ are dissymmetrical relative to said field. In these conditions, there is a resistance contrast even if the magnetization of the layer CMF is parallel to $H_p$. However, this contrast risks being relatively low.

In order to validate the concept and its feasibility, simulations by finite elements were carried out to evaluate the stresses generated, and their effect on the magnetization of the magnetic element. The simulations to evaluate the stresses were performed with the following parameters:

Size of the magnetic element: great axis: 45 nm, small axis: 25 nm, thickness: 20 nm, orientation 45°.
Distance between electrodes: 130 nm.
Length of the electrodes: 120 nm.
Height of the electrodes: 50 nm.
Material of the electrodes and of the magnetic element: characterized by a Young's modulus of 110 GPa.
Thickness of the piezoelectric material: 60 nm.
Piezoelectric substrate: lead titanate zirconate, called PZT-5H, embedded in the base.

For a control voltage of −0.4 V, the relative elongation along OX of the magnetic element is approximately $1.2 \cdot 10^{-3}$ and the tensile stress is greater than 100 MPa. Conversely, for a control voltage of +0.4 V, the relative elongation of the magnetic element is approximately $-1.2 \cdot 10^{-3}$.

In the piezoelectric substrate, the maximum value of the electrical field does not exceed 10 MV/m, which is compatible with most of the usual piezoelectric materials, for which the disruptive field is typically of the order of 50 MV/m. The margin for maneuver makes it possible to envisage a reduction of the size of the cell: the lowering of the dimension of the active piezoelectric part can be compensated by an increase in the control voltage, while remaining within the operating limits of the material.

Magnetic simulations were also performed by considering a magnetic element made of Terfenol ($Tb_{0.3}Dy_{0.7}Fe_{1.9}$), having the dimensions indicated above and characterized by the following properties:

Magnetostrictive coefficients: $\lambda_{100}=100 \cdot 10^{-6}$ and $\lambda_{111}=1700 \cdot 10^{-6}$.
Magnetization at saturation: 1.2 Tesla.
Exchange coefficient: $1.1 \cdot 10^{-11}$ J/m.
Value of the polarization magnetic field $H_p$: 150 kA/m=1875 Oe.

The absolute value of the stresses $|\sigma_{xx}|$ is 100 MPa, as evaluated using the mechanical simulation.

The results of the simulations (FIGS. 4A and 4B) show that, whatever the initial state of the magnetization, the application of a voltage of −0.4 V reorients the magnetization along the axis −X (state $P_1$), whereas a voltage of +0.4 V reorients the magnetization along the axis +Y (state $P_2$). When the control is eliminated, the magnetization remains in the newly defined state: the simulations show that the system remains stabilized in the new energy local minimum.

The magnetic element ELM may have a form other than ellipsoid, for example rectangle, lozenge, "L", or any other form that can induce a magnetic nonuniformity "of form".

The magnetic anisotropy, moreover, need not necessarily be, or be exclusively, of geometrical origin. It may also be due to the microscopic structure of the element. An anisotropy of this type is naturally present in certain crystalline materials. It can also be obtained in polycrystalline or amorphous materials, for example by fabricating the magnetic element by deposition in an external magnetic field. This microstructural anisotropy can be combined with an anisotropy of form, or be used alone. In the latter case, the magnetic element may even have a circular form.

It is not essential for the magnetic element to be made up of a single magnetic domain, even though this is generally preferred. In all cases, the magnetic element should have small dimensions, preferably less than 1 µm, even less than or equal to 100 nm, in order to optimize the information storage density.

The magnetic element may be made of a single material and have a homogeneous structure, or else be micro- or nano-structured and/or have a composite structure, for example of multilayer type.

As has been explained above, the "magnetic element" can be made of any material that can exhibit a magnetic order even in the absence of an external magnetic field. It can notably be a ferromagnetic, ferrimagnetic, sperimagnetic or even antiferromagnetic material. All these materials exhibit a more or less intense magnetoelastic or magnetostrictive effect. In practice, for a good operation of the invention, this effect should not be too weak; in particular, a material used for the implementation of the invention should have a magnetostrictive coefficient $b^{\gamma,2}$ greater than or equal to 1 MPa, and preferably greater than or equal to 10 MPa, at least along one axis. Terfenol is especially indicated because of its particularly significant magnetostrictive coefficients.

As has been mentioned above, the magnetic polarization field need not necessarily be a magnetic field in the proper sense; it may also be an "equivalent magnetic field", due to exchange interactions.

If the magnetic polarization field is actually of magnetic nature, it can be generated by one or more coils ($B_1, B_2$), other conductors through which current is flowing, or permanent magnets (FIG. 5A). It may also be a "leakage field" generated by a magnetic polarization layer (permanent magnet) CPM arranged under (or over) the element ELM and separated therefrom by a separating layer CS having a thickness generally greater than 10 nm (FIG. 5B). An exchange polarization can be obtained by virtue of an exchange polarization layer CPE arranged under (or over) the element ELM and separated therefrom by a separating layer CS' having a thickness of the order of 1-10 nm or less (FIG. 5C). The techniques of polarization by magnetic field (FIGS. 5A and 5B) can act on a number of magnetic elements at the same time.

Whatever its physical nature, the magnetic polarization field need not necessarily be perpendicular to the easy magnetization axis, although it is generally preferred for the angle between the axes $a_1$ and $a_2$ to be between 80° and 100°. On the other hand, it is essential for these two axes not to be parallel with one another. The ratio between the intensity of the magnetic polarization field and that of the equivalent magnetic field characterizing the anisotropy of form (or microstructural anisotropy) of the magnetic material depends on the angle between the axes $a_1$ and $a_2$. This ratio should be chosen in such a way as to allow for the existence of two stable equilibrium orientations. In the case of the example, where $a_1$ and $a_2$ are mutually perpendicular, this ratio should be between $\sqrt{2}/2$ and 1.

As FIG. 3 shows, the two orientations of stable equilibrium are not necessarily aligned with the axes X and Y. Nor is it essential for them to be arranged symmetrically on either side of the axis $a_2$. In fact, this symmetry exists only if the axis $a_2$ is perpendicular to the axis $a_1$.

The axis X of application of the mechanical stresses should be distinct from the axes $a_1$ and $a_2$, but it need not necessarily bisect the angle formed by these two axes.

The substrate SP need not necessarily be piezoelectric: it may also be electrostrictive. On this, it must be stressed that the electrostrictive effect is quadratic: it is therefore not possible to switch from a compressive stress to a traction stress simply by reversing the potential difference at the terminals of the electrodes. To do this, it is necessary to use a polarization voltage $V_0$ on which the less intense signal $V_p$ is superimposed. In these conditions, the polarized electrostrictive material can be characterized by an "equivalent" piezoelectric coefficient.

In fact, all the dielectric materials are more or less electrostrictive, but in practice only piezoelectric or electrostrictive materials that have a sufficiently high equivalent piezoelectric coefficient (50 pm/V or more, at least along one axis) can be used in practice with satisfactory results.

What is essential for the operation of the memory element of the invention is that a modification of the field of mechanical stresses to which the magnetic element is subjected, obtained by electrical means, induces a change of its magnetic state. The modification of the mechanical stress field may be other than a simple change of sign, as in the example. It may be obtained by using a configuration of electrodes other than that of FIG. 1.

The magnetic element ELM may be embedded in the substrate SP, as in the example, or be deposited on its surface. Other forms of mechanical coupling can also be envisaged. These options are not always equivalent. When the magnetic element ELM is conductive, it is preferable for it not to be simply deposited on the surface of the substrate, because such an arrangement results in the curvature of the electrical field lines in the substrate and in the cancellation or, at least, in a strong reduction of the mechanical stresses. FIGS. 6A-6D show four possible configurations for a conductive magnetic element, and the corresponding electrical field lines (with V=0 and V>0 indicating the $V_p$ applied between the electrodes $EL_1$ and $EL_2$ in each configuration):

FIG. 6A: magnetic element embedded, electrodes buried: no curvature of the field lines, favorable configurations.

FIG. 6B: magnetic element embedded, electrodes simply deposited: no curvature of the field lines, favorable configurations.

FIG. 6C: magnetic element simply deposited, electrodes buried: significant curvature of the field lines, unfavorable configurations.

FIG. 6D: magnetic element simply deposited, electrodes simply deposited: significant curvature of the field lines, unfavorable configurations.

The configurations of FIGS. 6C and 6D can, on the other hand, profitably be used in the case of a non-conductive magnetic element, not inducing any curvature of the field lines.

The case of a conductive magnetic element is particularly important, because the best magnetostrictive materials currently known are compounds of Tb-TM or Sm-TM type, where TM represents an alloy of transition metals.

Figure 7A:
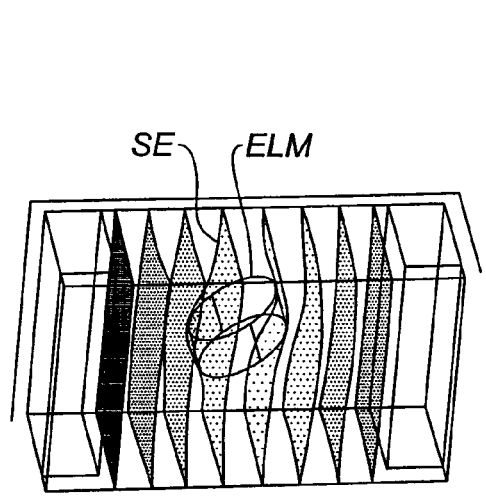
FIGS. 7A and 7B, respectively, the equipotential surfaces in a memory element according to an embodiment of the invention, and a possible geometry of the electrodes determined on the basis of these equipotential surfaces.
Figure 7B:
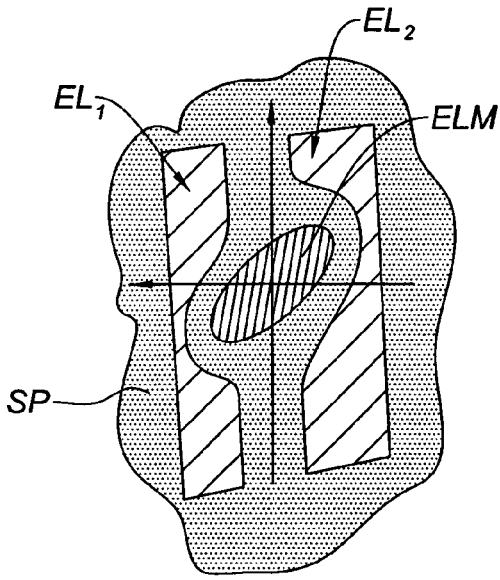

To reduce the bulk of the memory cell, it is essential to be able to bring the electrodes of the magnetic element close together. Their form will then be adapted to keep a form of the electrical field lines in the piezoelectric or electrostrictive material compatible with the generation of the anisotrope stresses in the plane. A good solution is to consider electrodes in the form of the equipotential surface areas which would be generated by planar electrodes located at a great distance from the magnetic element. Such equipotential surface areas SE are illustrated in FIG. 7A. FIG. 7B shows electrodes $EL_1$, $EL_2$ that have the form of equipotentials; it can be considered that they follow the form of the magnetic element ELM.

Figure 8:
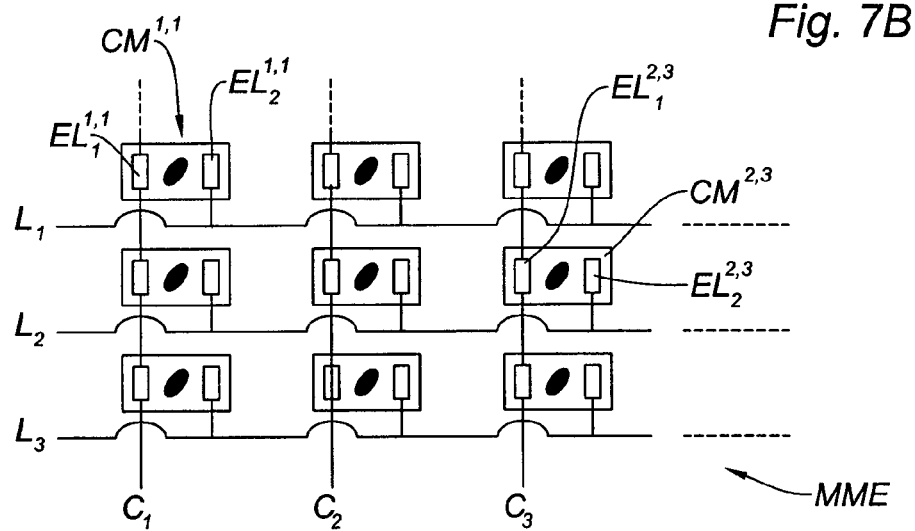
FIG. 8, a schematic representation of a direct access nonvolatile memory according to an embodiment of the invention.

Several memory cells $CM^{1,1} \ldots CM^{2,3} \ldots$ can be arranged in a matrix structure in rows and columns to form a direct access nonvolatile memory MME, as represented in FIG. 8. In this figure, the reference "$CM^{2,3}$" indicates the memory cell situated at the intersection of the second row and of the third column of the matrix. Each memory cell has a first and a second electrode (for example, $EL_1^{1,1}$ and $EL_2^{1,1}$ in the case of the cell $CM^{1,1}$, and $EL_1^{2,3}$ and $EL_2^{2,3}$ in the case of the cell $CM^{2,3}$). All the "first electrodes" of the cells of a same column are electrically connected together via respective conductors $C_1, C_2, C_3 \ldots$. Similarly, all the "second electrodes" of the cells of a same row are electrically connected together via respective conductors $L_{\&}, L_2, L_3 \ldots$. It is easy to realize the fact that, to store a logic "1" or "0" in the cell $CM^{i,j}$, it is sufficient to apply a potential difference of the appropriate sign and for an adequate duration between the conductors $L_i$ and $C_j$. A second set of rows $L'_i, C'_j$ can be used to connect the sensors of the different cells, thus forming a read matrix structure.

Figure 10:
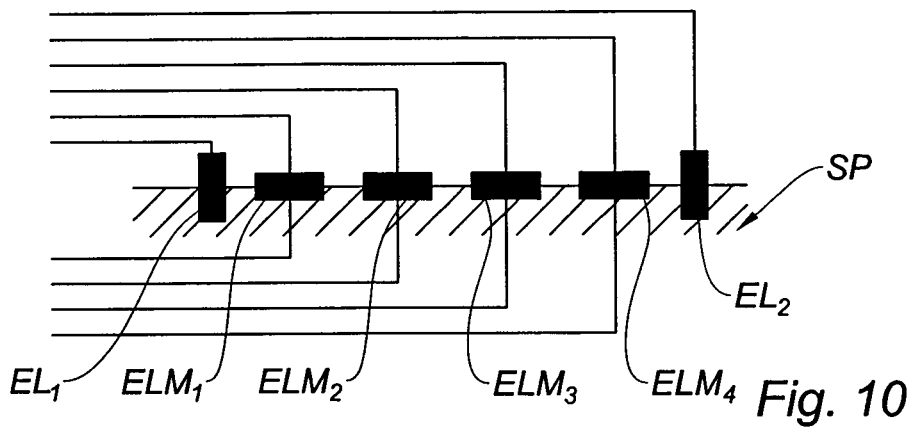
FIG. 10, a schematic representation of a direct access nonvolatile memory according to another embodiment of the invention.

According to a variant schematically illustrated in FIG. 10, it is possible to provide a memory with matrix structure in which the magnetic elements, being conductive, serve at the same time as electrodes for other memory elements. Thus, in the example of FIG. 10, the conductive magnetic elements ELM1 and ELM3, connected via their "read" contacts (references $CE_1$, $CE_2$ in the diagrams of FIGS. 12-14), serve as electrodes for the application of a potential difference to the piezoelectric material surrounding the element ELM2; similarly, the elements ELM2 and ELM4 serve as electrodes for the application of a potential difference to the piezoelectric material surrounding the element ELM3, and so on. The structure is much simpler than that of FIG. 8: there is no need to provide electrodes as separate elements (except at the ends of the alignment of magnetic elements: electrode $EL_1$ to the left of ELM1 and electrode EL2 to the right of ELM4), and a same set of electrical lines can serve both for reading and for writing.

Figure 9:
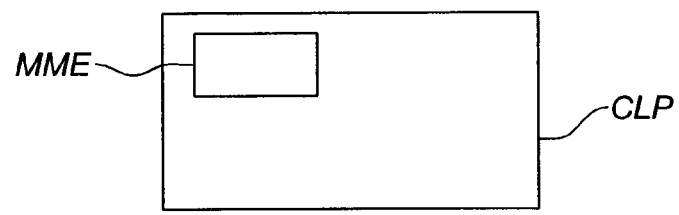
FIG. 9, a schematic representation of a programmable logic circuit according to an embodiment of the invention.

The memory MME can be used as mass storage medium, or for other applications. For example, it can be used to store the logic configuration of a programmable logic circuit CLP, as is schematically represented in FIG. 9. Its switchover speed is of the order of a nanosecond, as in the FeRams (ferroelectric memories). A cell size of the order of 50 nm×50 nm would appear realistic, which gives a capacity of approximately 40 Gbits/cm$^2$. One of the major advantages of the technology of the invention lies in its low consumption, and therefore heat dissipation, which favors a vertical integration by superimposition of several layers each consisting of a matrix of memory cells.

The invention claimed is:

1. A magnetoelectric memory element, comprising:
   a magnetic element having an easy magnetization axis aligned along a first axis;
   means for applying to said magnetic element a magnetic polarization field aligned along a second axis not parallel to said first axis, an intensity of said magnetic polarization field being chosen such that the magnetic element exhibits, by a combined effect of said magnetic polarization field and of said easy magnetization axis, two distinct states of stable equilibrium of magnetization of the magnetic element, corresponding to two different magnetization directions, which are not mutually opposed;
   a piezoelectric or electrostrictive substrate mechanically coupled with said magnetic element; and
   at least a first and a second electrode, arranged to apply an electrical field to the piezoelectric or electrostrictive substrate so that said substrate exerts on said magnetic element a non-isotropic mechanical stress, of a main direction generally oriented along a third axis, coplanar with, but distinct from, said first and second axes, said non-isotropic mechanical stress being sufficiently intense to induce, by magnetostrictive coupling, a switchover of a state of the magnetization of said magnetic element between the two distinct states of stable equilibrium.

2. The magnetoelectric memory element as claimed in claim 1, in which said magnetic element consists of a single magnetic domain.

3. The magnetoelectric memory element as claimed in claim 1, in which said magnetic element has an elongate form, wholly or partly determining said easy magnetization axis by anisotropy of form of magnetic material of the magnetic element.

4. The magnetoelectric memory element as claimed in claim 1, in which said magnetic element has an anisotrope microscopic structure wholly or partly determining said easy magnetization axis.

5. The magnetoelectric memory element as claimed in claim 4, in which said anisotrope microscopic structure is obtained by fabricating said magnetic element by deposition in the presence of an external magnetic field.

6. The magnetoelectric memory element as claimed in claim 1, comprising means for generating said magnetic polarization field in a form of an external magnetic field.

7. The magnetoelectric memory element as claimed in claim 1, comprising means for generating said magnetic polarization field in a form of an exchange field.

8. The magnetoelectric memory element as claimed in claim 1, comprising means for generating one said magnetic polarization field substantially perpendicular to said easy magnetization axis.

9. The magnetoelectric memory element as claimed in claim 8, in which said electrodes are arranged in such a way that said non-isotropic mechanical stress exerted by the substrate on the magnetic element forms a mean angle of between 40° and 50° both with said easy magnetization axis and with said magnetic polarization field.

10. The magnetoelectric memory element as claimed in claim 1, in which said electrodes follow a form of the magnetic element.

11. The magnetoelectric memory element as claimed in claim 1, in which said magnetic element is embedded in said substrate.

12. The magnetoelectric memory element as claimed in claim 1, in which said magnetic element is deposited on said substrate.

13. The magnetoelectric memory element as claimed in claim 1, in which said magnetic element has a single axis of magnetic anisotropy.

14. A memory cell comprising a magnetoelectric memory element as claimed in claim 1 and a magnetic sensor for determining a direction of the magnetization of said magnetic element.

15. The memory cell as claimed in claim 14, in which said sensor is chosen from: a Hall effect sensor and a magnetoresistance, tunnel effect magnetoresistance, giant magnetoresistance or colossal magnetoresistance sensor.

16. A direct access nonvolatile memory comprising a plurality of memory cells as claimed in claim 14, arranged according to a matrix scheme in rows and in columns, the first electrodes of the magnetoelectric memory elements of the memory cells of a same column being electrically linked together, and the second electrodes of the magnetoelectric memory elements of the memory cells of a same row being electrically linked together.

17. A programmable logic circuit comprising a plurality of memory cells as claimed in claim 14 as means for storing a logic configuration.

18. A memristive device, comprising:
  a magnetic element having an easy magnetization axis aligned along a first axis;
  means for applying to said magnetic element a magnetic polarization field aligned along a second axis not parallel to said first axis, an intensity of said magnetic polarization field being chosen such that the magnetic element exhibits, by a combined effect of said magnetic polarization field and of said easy magnetization axis, two states of stable equilibrium of magnetization of the magnetic element, corresponding to directions of magnetization forming between them an angle $0 \leq \alpha < 90°$;
  a piezoelectric or electrostrictive substrate mechanically coupled with said magnetic element;
  at least a first and a second electrode, arranged to apply an electrical field to the piezoelectric or electrostrictive substrate in such a way that said substrate exerts on said magnetic element a non-isotropic mechanical stress, of a main direction generally oriented along a third axis, coplanar with, but distinct from, said first and second axes; and
  a magnetic sensor having two terminals, the electrical resistance between the two terminals depending on a direction of the magnetization of said magnetic element.

19. The memristive device as claimed in claim 18, in which the two states of stable equilibrium of the magnetization of the magnetic element coincide and the angle $\alpha=0°$.

* * * * *